US010715923B2

(12) United States Patent
Zou

(10) Patent No.: US 10,715,923 B2
(45) Date of Patent: Jul. 14, 2020

(54) CONDENSER MEMS MICROPHONE AND ELECTRONIC APPARATUS

(71) Applicant: GOERTEK INC., Weifang, Shandong (CN)

(72) Inventor: Quanbo Zou, Weifang (CN)

(73) Assignee: GOERTEK INC., Weifang, Shandong (CN)

(*) Notice: Subject to any disclaimer, the term of this patent is extended or adjusted under 35 U.S.C. 154(b) by 0 days.

(21) Appl. No.: 16/316,535

(22) PCT Filed: Jul. 11, 2016

(86) PCT No.: PCT/CN2016/089638
§ 371 (c)(1),
(2) Date: Jan. 9, 2019

(87) PCT Pub. No.: WO2018/010065
PCT Pub. Date: Jan. 18, 2018

(65) Prior Publication Data
US 2019/0306629 A1    Oct. 3, 2019

(51) Int. Cl.
H04R 19/00    (2006.01)
H04R 19/04    (2006.01)

(52) U.S. Cl.
CPC .......... *H04R 19/005* (2013.01); *H04R 19/04* (2013.01); *B81B 2201/0257* (2013.01)

(58) Field of Classification Search
CPC .................................................. H04R 19/005
USPC ......................................................... 381/175
See application file for complete search history.

(56) References Cited

U.S. PATENT DOCUMENTS

| 8,692,340 | B1 | 4/2014 | Ata et al. |
| 9,428,379 | B2* | 8/2016 | Ata .................. B81B 3/001 |
| 2008/0192963 | A1 | 8/2008 | Sato |
| 2010/0117168 | A1 | 5/2010 | Wu et al. |
| 2013/0263662 | A1 | 10/2013 | Tanaka |
| 2015/0020591 | A1 | 1/2015 | Tanaka |
| 2015/0158722 | A1* | 6/2015 | Lim ................... B81B 7/02 257/416 |

FOREIGN PATENT DOCUMENTS

| CN | 101242682 A | 8/2008 |
| CN | 101379873 | 3/2009 |
| CN | 101742389 A | 6/2010 |
| CN | 102972045 | 3/2013 |
| CN | 103364589 A | 10/2013 |
| CN | 104297524 A | 1/2015 |
| CN | 105051909 A | 11/2015 |
| JP | 2014149234 A | 8/2014 |

* cited by examiner

Primary Examiner — Suhan Ni
(74) Attorney, Agent, or Firm — Saliwanchik, Lloyd & Eisenschenk

(57) ABSTRACT

Disclosed are a condenser MEMS microphone and an electronic apparatus. The condenser MEMS microphone comprises: a substrate; a bottom plate placed on the substrate; and a top plate placed above the bottom plate and spaced from the bottom plate, wherein the top plate is torsional with respect to a first torsional axis and is divided into a first part and a second part by the first torsional axis, the first part and the second part form two condensers with the bottom plate, and a first group of acoustic holes are provided in the first part of the top plate.

10 Claims, 3 Drawing Sheets ns. It should be noted that the relative arrangement of the components and steps, the numerical expressions and numerical values set forth in these embodiments do not limit the scope of the present invention unless it is specifically stated otherwise.

CONDENSER MEMS MICROPHONE AND ELECTRONIC APPARATUS

CROSS REFERENCE TO A RELATED APPLICATION

This application is a National Stage of International Application No. PCT/CN2016/089638 filed on Jul. 11, 2016, which is hereby incorporated by reference in its entirety.

FIELD OF THE INVENTION

The present invention relates to the field of MEMS microphone, and in particular, to a condenser MEMS microphone and an electronic apparatus.

BACKGROUND OF THE INVENTION

Microphones are transducers that convert, acoustic energy into electronic energy. Many transduction principles have been developed, including the piezoelectric microphone, the capacitive microphone and the contact microphone.

In the prior art, the majority of silicon microphones are based on the capacitive detection principle. These microphones are also called as the capacitive microphone or condenser microphone.

To improve the performance of a microphone such as sensitivity, a differential condenser may be used. A kind of condenser microphones includes condensers/capacitors among different diaphragms or back plate. For example, U.S. Pat. No. 8,860,154 discloses a CMOS compatible silicon differential condenser microphone, which is hereby incorporated herein by reference.

In the prior art, to provide a differential MEMS microphone, a three-layers structure is required. For example, in such a structure, the top layer is a diaphragm with a first electrode, the middle layer is a back plate with a center electrode, and the bottom layer is a diaphragm with a second electrode. The first and the second electrodes are used to output differential signals.

The Micro-Electro-Mechanical Systems, or MEMS, refers to a miniaturized mechanical and electro-mechanical member (i.e., devices and structures) that is made using the techniques of micro-fabrication. A MEMS microphone is a microphone which is based on MEMS technology.

Therefore, there is a demand in the art that a new condenser MEMS microphone shall be proposed to address at least one of the problems in the prior art.

SUMMARY OF THE INVENTION

One object of this invention is to provide a new technical solution for a condenser MEMS microphone.

According to a first aspect of the present invention, there is provided a condenser MEMS microphone, comprising: a substrate; a bottom plate placed on the substrate; and a top plate placed above the bottom plate and spaced from the bottom plate, wherein the top plate is torsional with respect to a first torsional axis and is divided into a first part and a second part by the first torsional axis, the first part and the second part form two condensers with the bottom plate, and a first group of acoustic holes are provided in the first part of the top plate.

Optionally or alternatively, the top plate is placed on the substrate at the ends of the first torsional axis.

Optionally or alternatively, the bottom plate is torsional with respect to a second torsional axis and is divided into a third part and a fourth part by the second torsional axis, the second torsional axis corresponds to the first torsional axis, and the third part and the fourth part correspond to the first part and the second part, respectively.

Optionally or alternatively, the bottom plate is placed on the substrate at the ends of the second torsional axis.

Optionally or alternatively, a second group of acoustic holes are provided in the fourth part of the bottom plate.

Optionally or alternatively, at least one of the top and bottom plates are stiff enough in out-of-plane movement, compared to torsional stiffness.

Optionally or alternatively, a first electrode is placed on the first part, a second electrode is placed on the second part, a center electrode is placed on the bottom plate, and the first and second electrodes are used for providing differential sensing signals.

Optionally or alternatively, the top plate is of polycrystalline silicon, and the first and second electrodes are isolated by patterning of doping.

Optionally or alternatively, the top and bottom plates are placed on the substrate via a dielectric layer.

According to a second aspect of the present invention, there is provided an electronic apparatus, comprising a condenser MEMS microphone according to the present invention.

According to an embodiment of this invention, a novel condenser MEMS microphone of two layers is provided.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description thereof, serve to explain the principles of the invention.

DETAILED DESCRIPTION OF THE EMBODIMENTS

Figure 1:
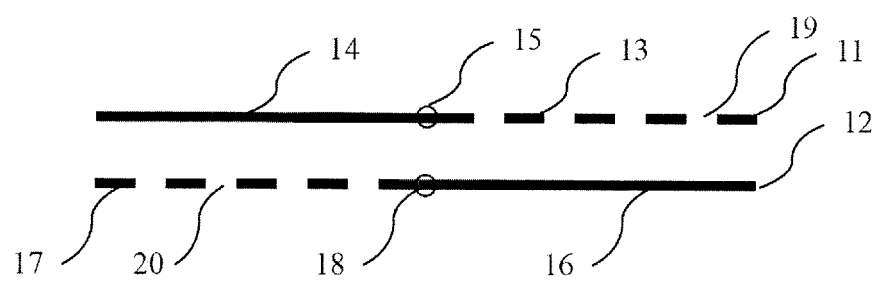
FIG. 1 is a schematic sectional view of a top plate and a bottom plate of a condenser MEMS microphone according to a first embodiment of this invention.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

The structure of the prior art differential MEMS condenser microphone using 3 layers of MEMS is either backplate-diaphragm-backplate or diaphragm-backplate-diaphragm. If the layers can be reduced, the cost will be lowered.

In embodiments of this invention, a condenser MEMS microphone of two layers is proposed. Embodiments and examples of this invention will be described with reference to FIGS. 1-7.

Figure 2:
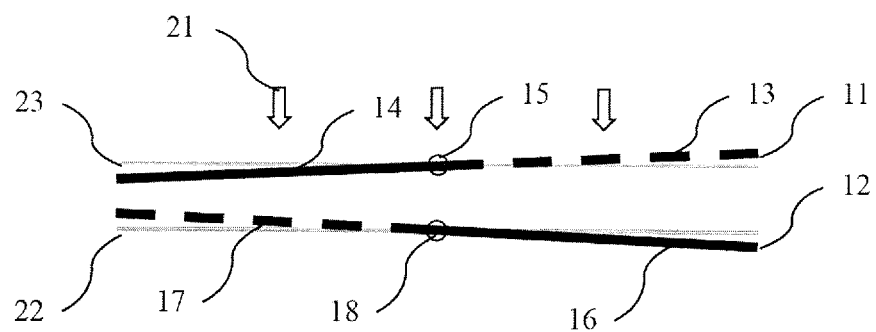
FIG. 2 is a schematic sectional view of the top plate and the bottom plate of the condenser MEMS microphone according to the first embodiment of this invention when receiving sound pressure.
Figure 3:
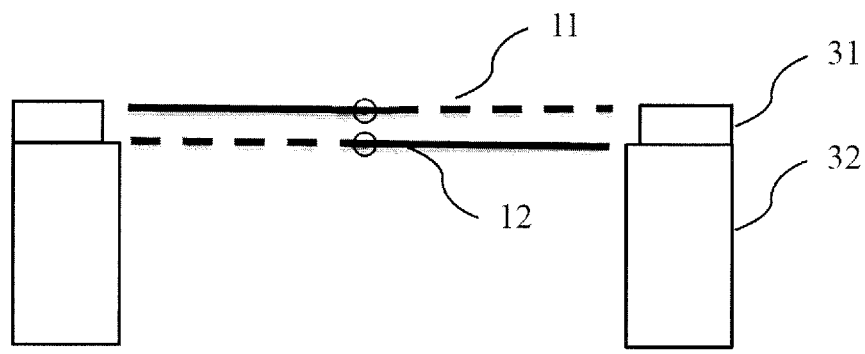
FIG. 3 is a schematic sectional view of the top plate, the bottom plate, mounted on a substrate via a dielectric layer, of the condenser MEMS microphone according to the first embodiment of this invention.
Figure 4:
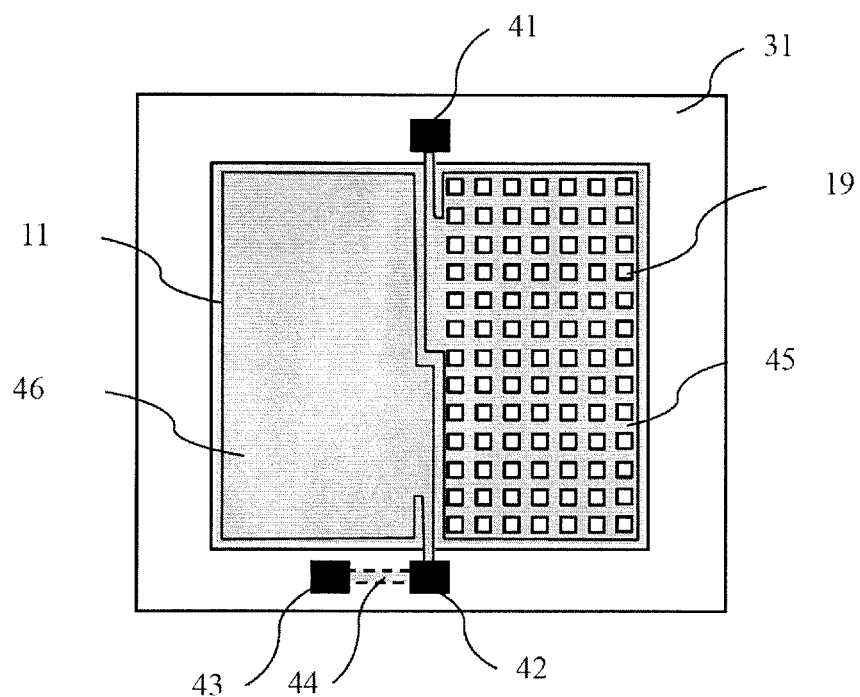
FIG. 4 is a schematic top view of the condenser MEMS microphone according to the first embodiment of this invention.

FIGS. 1-4 shows a condenser MEMS microphone according to a first embodiment of this invention. FIG. 1 shows a schematic sectional view of a top plate and a bottom plate of the condenser MEMS microphone. FIG. 2 shows a schematic sectional view of the top plate and the bottom plate of the condenser MEMS microphone when receiving sound pressure. FIG. 3 shows a schematic sectional view of the top plate, the bottom plate, mounted on a substrate via a dielectric layer, of the condenser MEMS microphone. FIG. 4 shows a schematic top view of the condenser MEMS microphone.

As shown in FIG. 3, the condenser MEMS microphone comprises a substrate 32, a bottom plate 12 and a top plate 11.

The bottom plate 12 is placed on the substrate 32. It shall be understood by a person skilled in the art that the bottom plate 12 can be positioned above the substrate 12, parallel with a surface of the substrate 12, or in the substrate 12 (such as in a cavity of the substrate).

As shown in FIG. 1, the top plate 11 is placed above the bottom plate and spaced from the bottom plate 12. The top plate 1 is torsional with respect to a first torsional axis 15. Generally, to make the top plate 11 torsional, the first torsional axis 15 can be fixed. A person skilled in the art could conceive many approaches to fix/support the axis. For example, as shown in FIGS. 1 and 4, the top plate 11 is placed on the substrate 32 at the ends of the first torsional axis 15. For example, the top plate 11 is placed at the positions 41, 42 on the substrate 32 via a dielectric layer 31. In addition, pads can be provided at positions 41, 42, for example.

The top plate 1 can be divided into a first part 13 and a second part 14 by the first torsional axis 15. The first part 13 and the second part 14 form two condensers with the bottom plate 12. For example, the first part forms a first condenser with the bottom plate and the second part forms a second condenser with the bottom plate. A first group of acoustic holes 19 are provided in the first part 13 of the top plate 11.

In the first embodiment, the bottom plate 12 is also torsional with respect to a second torsional axis 18. The bottom plate 12 is divided into a third part 16 and a fourth part 17 by the second torsional axis 18. The second torsional axis 18 corresponds to the first torsional axis 15. The third part 16 and the fourth part 17 correspond to the first part 13 and the second part 14, respectively.

Similar with the top plate 11, the bottom plate 12 can also be placed on the substrate 32 at the ends of the second torsional axis 18. For example, as shown in FIG. 4, one end of the second torsional axis 18 is led out to a bond pad 43 via line 44. The bottom plate 12 can be placed on the substrate 32 via the dielectric layer 31. It will be understood by a person skilled in the art that FIG. 4 only shows the top plate and the bottom plate is under the top plate.

As shown in FIG. 1, a second group of acoustic holes 20 are provided in the fourth part 17 of the bottom plate 12. The first and second groups of acoustic holes are displaced with each other. That is, the first group of acoustic holes in the first part correspond to the third part without holes, and the second part corresponds to the fourth part with holes.

As shown in FIG. 2, when a sound pressure 21 is applied on the top plate 11, the air goes into a gap between the first plate 11 and the second plate 12 via the acoustic holes in the first part 13 and applies a pressure on the third part 16 to push it down. The second part 14 is also pushed down under the sound pressure 21, and air flow will go through the second group of acoustic holes 20, for example. Then, the top plate 11 and the bottom plate 12 displace from their original positions 22, 23.

For example, a first electrode 45 is placed on the first part 13 and a second electrode 46 is placed on the second part 14, as shown in FIG. 4. A electrode (or ground electrode, not shown) is placed on the bottom plate 12. For example, the center electrode is led out to the bond pad 43. The first and second electrodes are used for providing differential sensing signals. For example, the first electrode and the center electrode forms a first condenser, and the second electrode and the center electrode forms a second condenser. In the situation of FIG. 2, for example, the capacity of the first condenser could be: $C1=C0-\Delta C$. The capacity of the second condenser could be: $C2=C0+\Delta C$. Differential signals reflecting the capacity changes will be generated in the first and second electrodes. In this embodiment, with the displacement structure of acoustic holes and solid plate, a flat frequency response will be obtained and noise will almost not be increased, since plate displacement at around torsional bars is negligible.

Although the first and second electrodes are placed on the top plate and the center electrode is placed on the bottom plate, it could also be conceived by a person skilled in the art the first and second electrodes can also be placed on the bottom plate and the center electrode can also be placed on the top plate.

It would be understood by a person in the art that although, in the first embodiment, the first and second groups of acoustic holes are provided in the top plate and the top and bottom plates are torsional, a person skilled in the art could conceive a lot of feasible modifications or alternatives.

Figure 5:
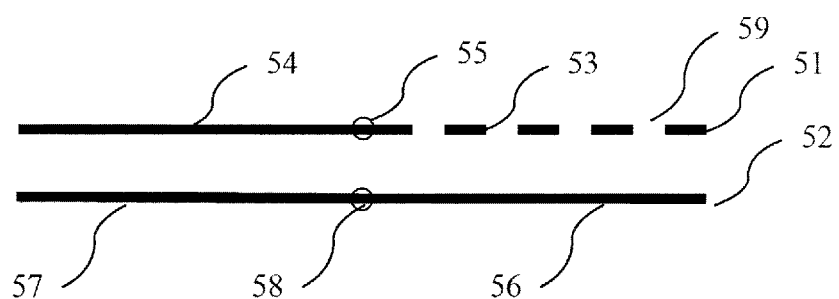
FIG. 5 is a schematic sectional view of a top plate and a bottom plate of a condenser MEMS microphone according to a second embodiment of this invention.

For example, FIG. 5 shows a schematic sectional view of a top plate and a bottom plate of a condenser MEMS microphone according to a second embodiment of this invention. In the second embodiment, the top plate 51 is torsional with respect to the first torsional axis 55. The top plate 51 is divided into a first part 53 and a second part 54 by the first torsional axis 55. The first part 53 is provided with a first group of acoustic holes 59. The bottom plate 52 is torsional with respect to a second torsional axis 58. The bottom plate 52 is divided into a third part 56 and a fourth part 57. The third part 56 and the fourth part 57 are not provided with holes. It shall be appreciated by a person skilled in the art that although the bottom plate 52 is shown to be torsional in FIG. 5, the bottom plate 52 can be fixed.

Figure 6:
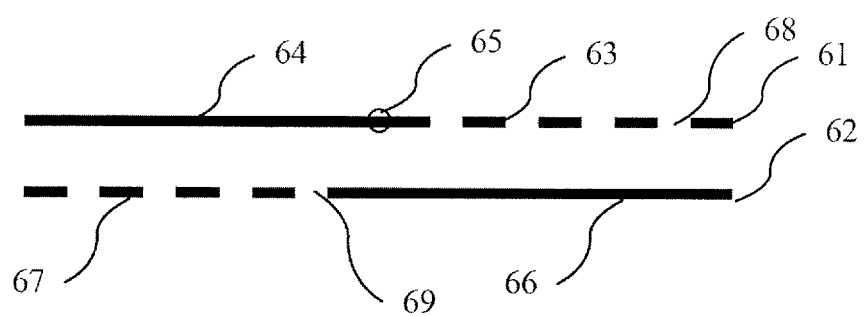
FIG. 6 is a schematic sectional view of a top plate and a bottom plate of a condenser MEMS microphone according to a third embodiment of this invention.

For example, FIG. 6 shows a schematic sectional view of a top plate and a bottom plate of a condenser MEMS microphone according to a third embodiment of this invention. In the third embodiment, the top plate 61 is torsional with respect to the first torsional axis 65. The top plate 61 is divided into a first part 63 and a second part 64 by the first torsional axis 65. The first part 63 is provided with a first group of acoustic holes 68. The bottom plate 62 is not torsional. The bottom plate 62 has a third part 66 and a fourth part 67. The fourth part 67 is provided with acoustic holes 69.

Figure 7:
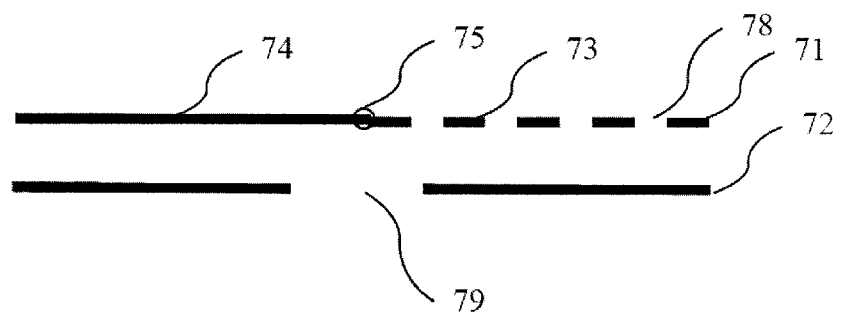
FIG. 7 is a schematic sectional view of a top plate and a bottom plate of a condenser MEMS microphone according to a fourth embodiment of this invention.

For example, FIG. 7 shows a schematic sectional view of a top plate and a bottom plate of a condenser MEMS microphone according to a fourth embodiment of this invention. In the fourth embodiment, the top plate 71 is torsional with respect to the first torsional axis 75. The top plate 71 is divided into a first part 73 and a second part 74 by the first torsional axis 75. The first part 73 is provided with a first group of acoustic holes 78. The bottom plate 72 is not torsional. The bottom plate 72 is provided with an acoustic hole 79.

FIGS. 5-7 shows three modifications/alternatives of the invention. It will be understood by a person skilled in the art that many other modifications/alternatives can be made within the concept of this invention. The second to fourth embodiments shown in FIGS. 5-7 just focus on the arrangement of the top and bottom plate, and other portions of the microphone can be same as or similar with those of the first embodiment.

Back to the first embodiment, at least one of the top and bottom plates are stiff enough in out-of-plane movement, compared to torsional stiffness. In this regard, the displacement of the plate(s) is mainly the torsional movement and the out-of-plane movement. This could ensure the reduction of noise.

In an embodiment, the substrate 32 is silicon, for example. The dielectric layer is $SiO_2$, doped $SiO_2$, BSG (boron-silicate-glass), PSG (phosphor-silicate-glass) or BPSG etc.

For example, the bottom plate can be made of doped polycrystalline or crystalline silicon in tension, for high out-of-plane stiffness.

For example, the top plate can be of polycrystalline silicon. The first and second electrodes can be isolated by patterning of doping, for example. Alternatively, the top plate can be composite of silicon nitride (SiNx) and poly-Si. For example, the top plate have a sandwiched structure of SiNx/polySi/SiNx.

The condenser MEMS microphone of this invention can be used in an electronic apparatus. The electronic apparatus can be smart phone, pad, or sound sensor, etc. In this regard, in another embodiment, an electronic apparatus comprising a condenser MEMS microphone according to an embodiment of the present invention is provided.

Although some specific embodiments of the present invention have been demonstrated in detail with examples, it should be understood by a person skilled in the art that the above examples are only intended to be illustrative but not to limit the scope of the present invention. It should be understood by a person skilled in the art that the above embodiments can be modified without departing from the scope and spirit of the present invention. The scope of the present invention is defined by the attached claims.

What is claimed is:

1. A condenser MEMS microphone, comprising:
a substrate;
a bottom plate placed on the substrate; and
a top plate placed above the bottom plate and spaced from the bottom plate,
wherein the top plate is torsional with respect to a first torsional axis and is divided into a first part and a second part by the first torsional axis, the first part and the second part from two condensers with the bottom plate, and a first group of acoustic holes are provided in the first part of the top plate, and
wherein the bottom plate is torsional with respect to a second torsional axis and is divided into a third part and a fourth part by the second torsional axis, the second torsional axis corresponds to the first torsional axis, and the third part and the fourth part correspond to the first part and the second part, respectively.

2. The condenser MEMS microphone according to claim 1, wherein the top plate is placed on the substrate at the ends of the first torsional axis.

3. An electronic apparatus, comprising a condenser MEMS microphone according to claim 2.

4. The condenser MEMS microphone according to claim 1, wherein the bottom plate is placed on the substrate at the ends of the second torsional axis.

5. The condenser MEMS microphone according to claim 1, wherein a second group of acoustic holes are provided in the fourth part of the bottom plate.

6. The condenser MEMS microphone according claim 1, wherein at least one of the top and bottom plates are stiff enough in out-of-plane movement, compared to torsional stiffness.

7. The condenser MEMS microphone according to claim 1, wherein a first electrode is placed on the first part, a second electrode is placed on the second part, a center electrode is placed on the bottom plate, and the first and second electrodes are used for providing differential sensing signals.

8. The condenser MEMS microphone according to claim 7, wherein the top plate is of polycrystalline silicon, and the first and second electrodes are isolated by patterning of doping.

9. The condenser MEMS microphone according to claim 1, wherein the top and bottom plates are placed on the substrate via a dielectric layer.

10. An electronic apparatus, comprising a condenser MEMS microphone according to claim 1.

* * * * *